United States Patent
Yamamoto et al.

(10) Patent No.: US 11,335,880 B2
(45) Date of Patent: May 17, 2022

(54) FLEXIBLE DISPLAY WITH PROTECTOR ALONG SIDE SURFACE

(71) Applicant: Sony Group Corporation, Tokyo (JP)

(72) Inventors: Takeshi Yamamoto, Tokyo (JP); Soya Araki, Kanagawa (JP); Yoshinori Tachikawa, Tokyo (JP); Yoichiro Eshita, Tokyo (JP); Yohei Azuma, Kanagawa (JP); Hayato Niwa, Tokyo (JP)

(73) Assignee: Sony Group Corporation

( * ) Notice: Subject to any disclaimer, the term of this patent is extended or adjusted under 35 U.S.C. 154(b) by 0 days.

(21) Appl. No.: 16/767,646

(22) PCT Filed: Oct. 25, 2018

(86) PCT No.: PCT/JP2018/039679
§ 371 (c)(1),
(2) Date: May 28, 2020

(87) PCT Pub. No.: WO2019/111577
PCT Pub. Date: Jun. 13, 2019

(65) Prior Publication Data
US 2021/0119174 A1    Apr. 22, 2021

(30) Foreign Application Priority Data

Dec. 7, 2017   (JP) .............................. JP2017-235270

(51) Int. Cl.
*H01L 51/52* (2006.01)
*H01L 51/00* (2006.01)

(52) U.S. Cl.
CPC ...... *H01L 51/5246* (2013.01); *H01L 51/0097* (2013.01); *H01L 2251/5338* (2013.01)

(58) Field of Classification Search
CPC ............. H01L 51/5246; H01L 51/0097; H01L 2251/5338
(Continued)

(56) References Cited

U.S. PATENT DOCUMENTS

2004/0183958 A1   9/2004 Akiyama et al.
2007/0194711 A1   8/2007 Matsuura et al.
(Continued)

FOREIGN PATENT DOCUMENTS

JP   2004279867 A   10/2004
JP   2005302436 A   10/2005
(Continued)

OTHER PUBLICATIONS

International Search Report from Application No. PCT/JP2018/039679 dated Jan. 29, 2019, 2 pages.

*Primary Examiner* — Xia L Cross
(74) *Attorney, Agent, or Firm* — Lerner, David, Littenberg, Krumholz & Mentlik, LLP

(57) ABSTRACT

A display includes a display section including a flexible base and an image display layer that is supported by the flexible base and displays an image by utilizing an organic light-emitting phenomenon, in which the display section has a display surface on which the image is to be displayed, a back surface located opposite to the display surface, and a side surface located between the display surface and the back surface and coupled to each of the display surface and the back surface, and a protector provided along at least a portion of the side surface of the display section. The protector includes a metal layer and covers a region extending from a portion of the display surface through the side surface to a portion of the back surface.

12 Claims, 10 Drawing Sheets

(58) Field of Classification Search
USPC .......................................................... 257/40
See application file for complete search history.

(56) References Cited

U.S. PATENT DOCUMENTS

| | | |
|---|---|---|
| 2010/0148209 A1 | 6/2010 | Hatano et al. |
| 2013/0334981 A1 | 12/2013 | Kwack et al. |
| 2015/0138737 A1 | 5/2015 | Yukawa |
| 2016/0190055 A1* | 6/2016 | Jinbo .................... H01L 51/524 |
| | | 257/99 |

FOREIGN PATENT DOCUMENTS

| | | |
|---|---|---|
| JP | 2007220593 A | 8/2007 |
| JP | 2016127018 A | 7/2016 |
| JP | 6004570 B2 | 10/2016 |
| JP | 2016197597 A | 11/2016 |
| WO | 2005104266 A1 | 11/2005 |
| WO | 2014010329 A1 | 1/2014 |

* cited by examiner

[ FIG. 1 ]
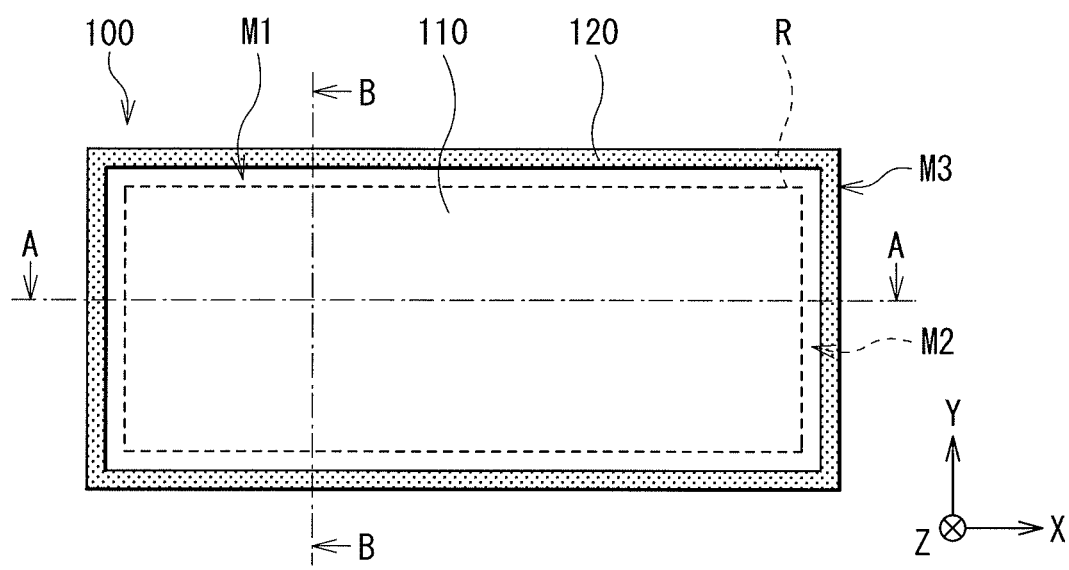
[ FIG. 2 ]
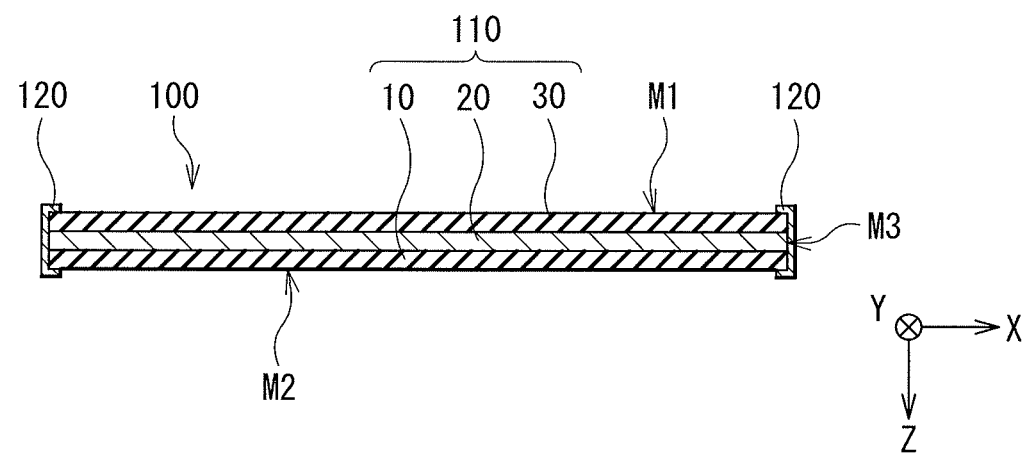

[ FIG. 3 ]
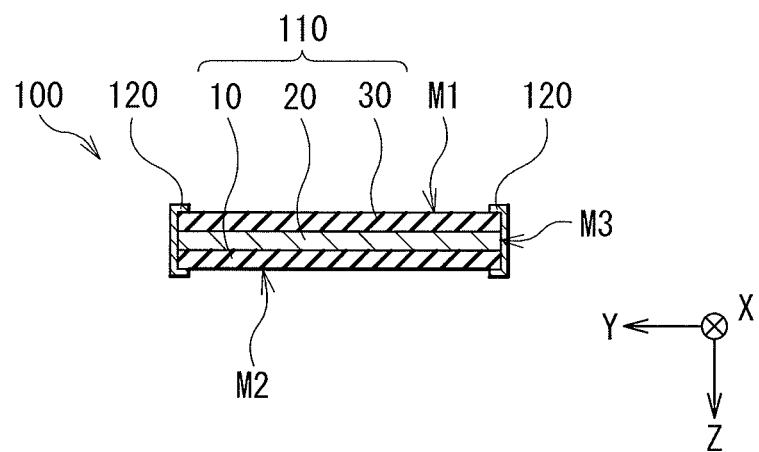
[ FIG. 4 ]
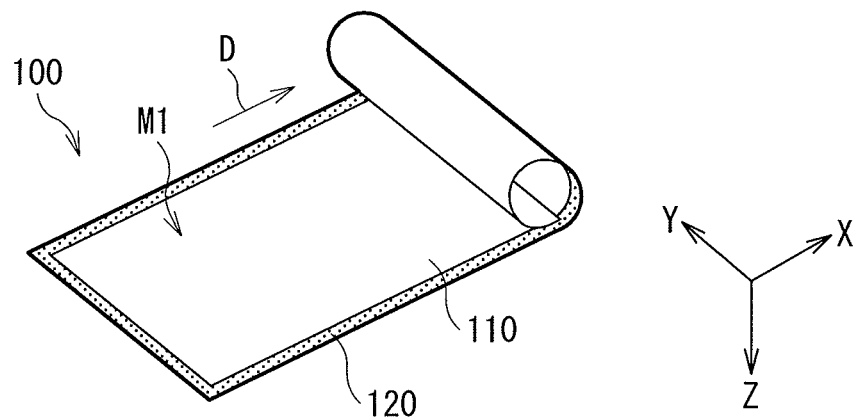

[FIG. 5]
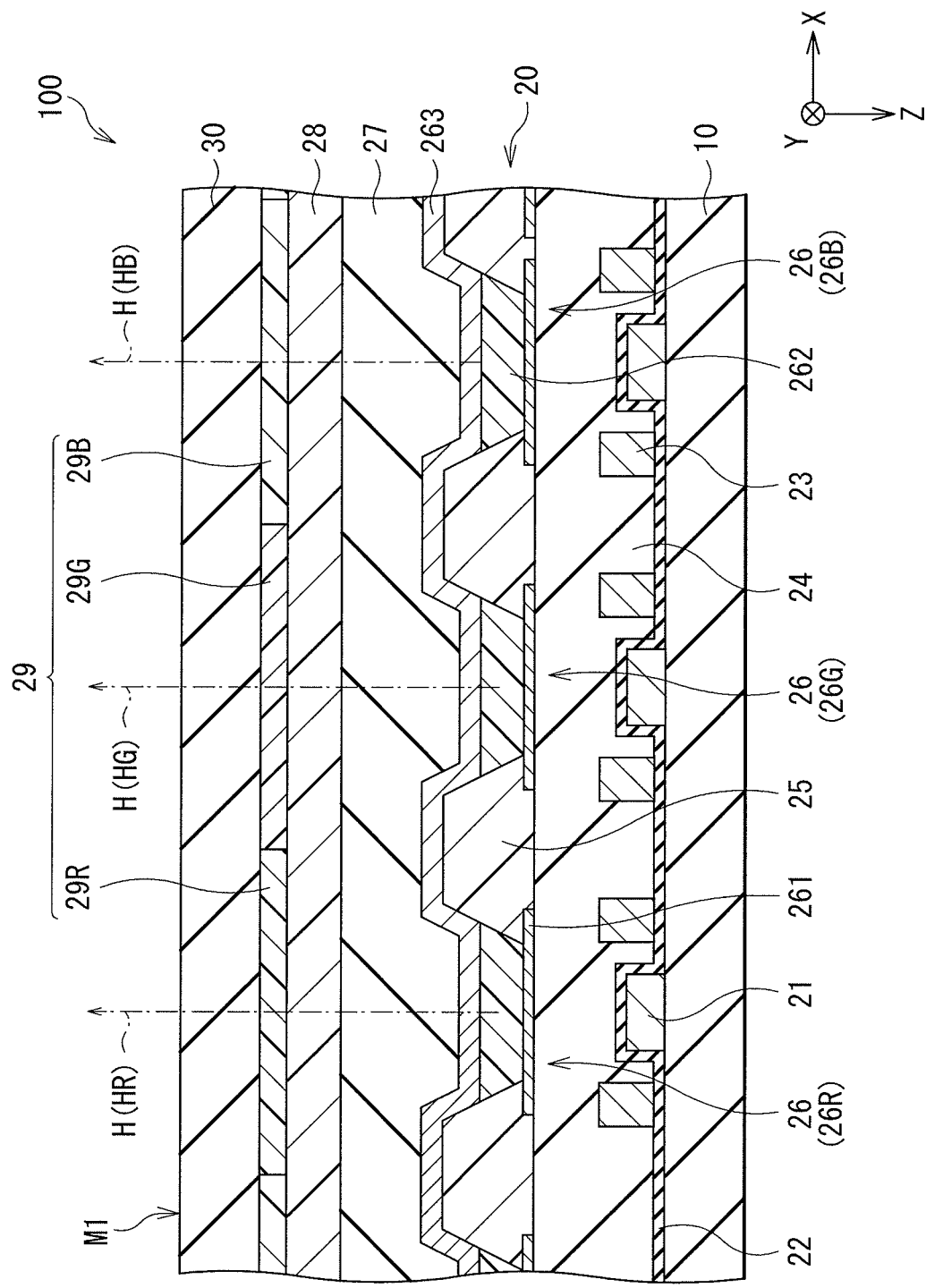

[ FIG. 6 ]
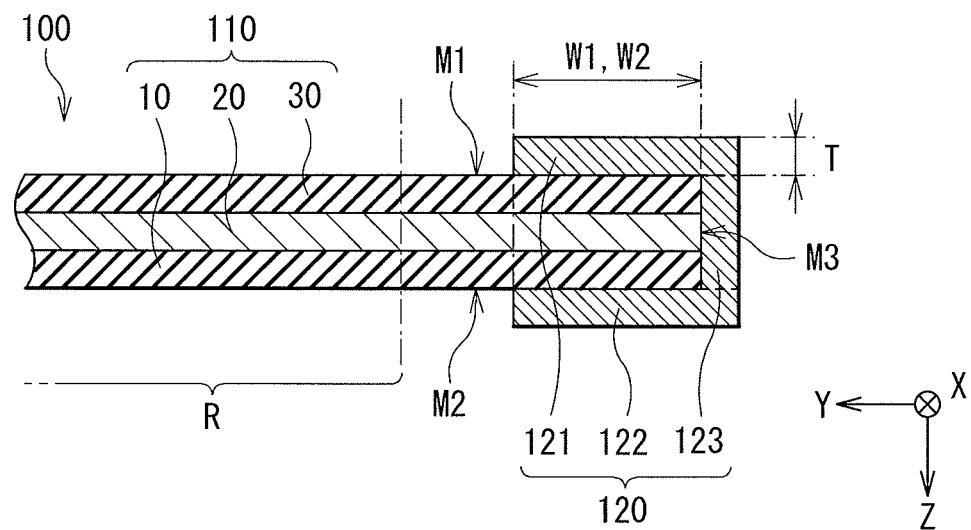
[ FIG. 7 ]
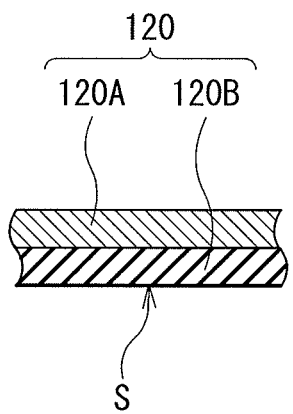

[ FIG. 8 ]
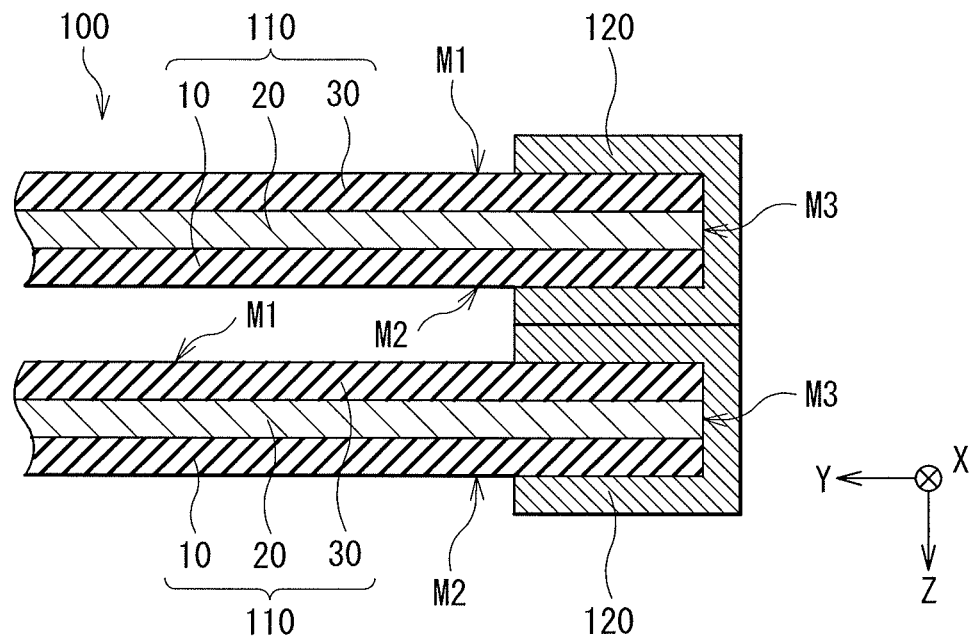
[ FIG. 9 ]
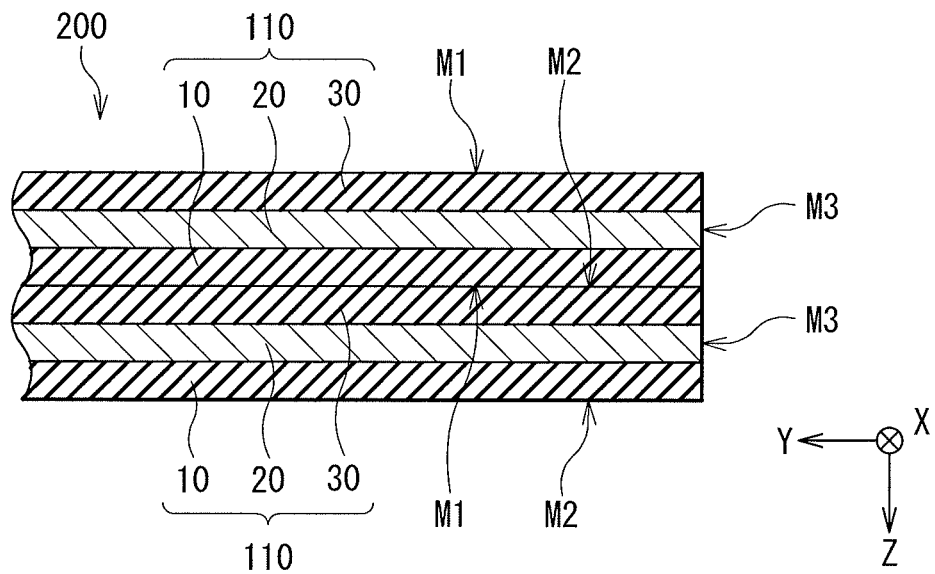

[ FIG. 10 ]
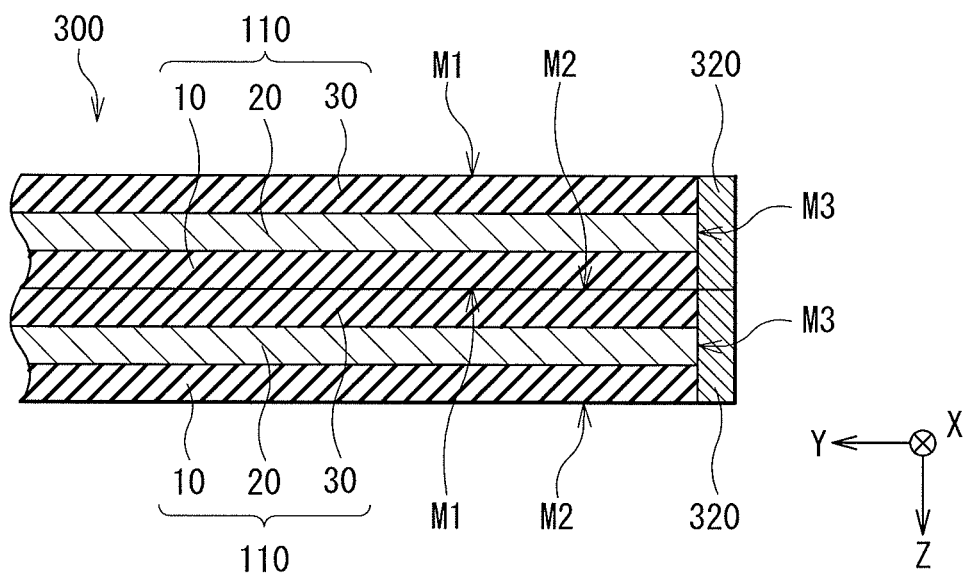
[ FIG. 11 ]
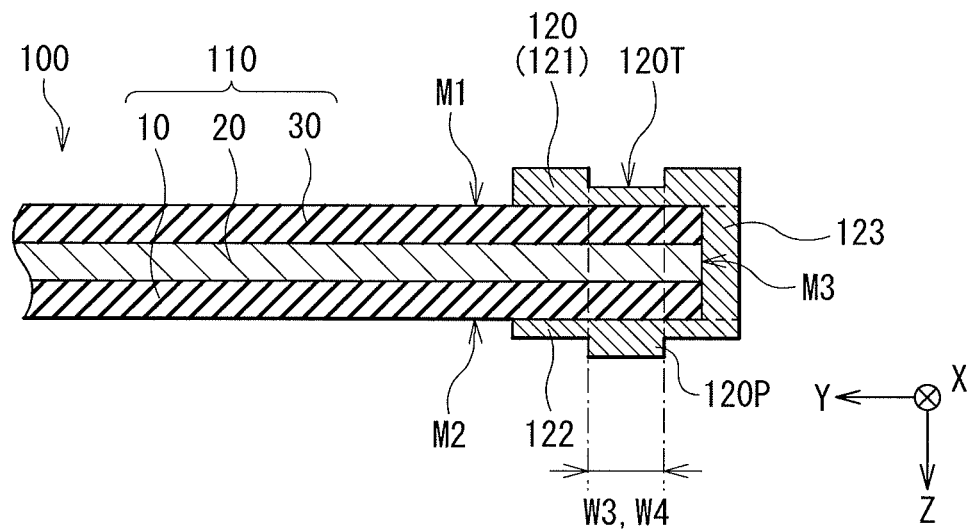

[ FIG. 12 ]
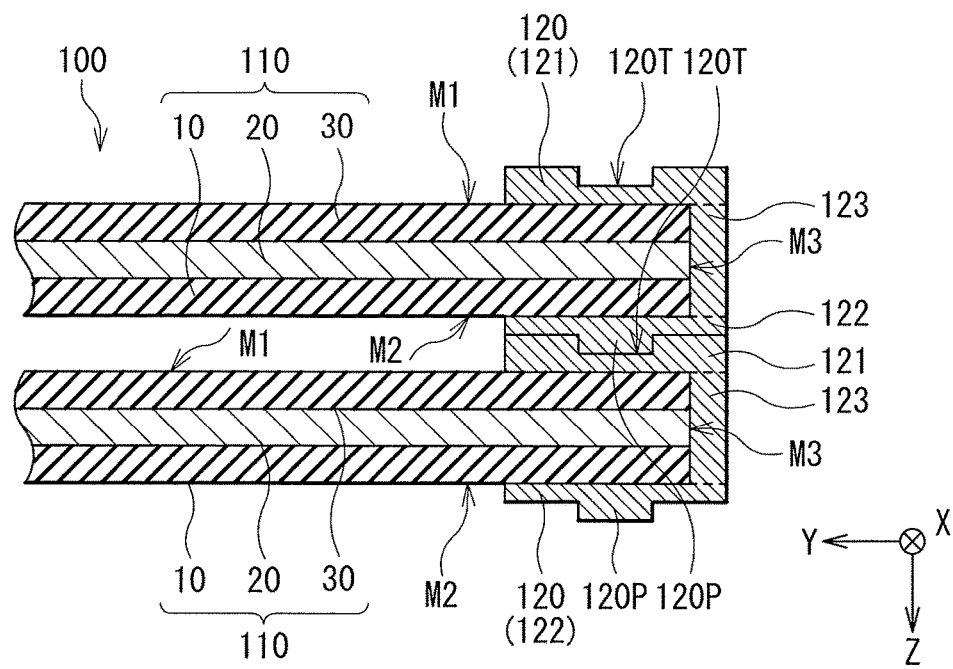
[ FIG. 13 ]
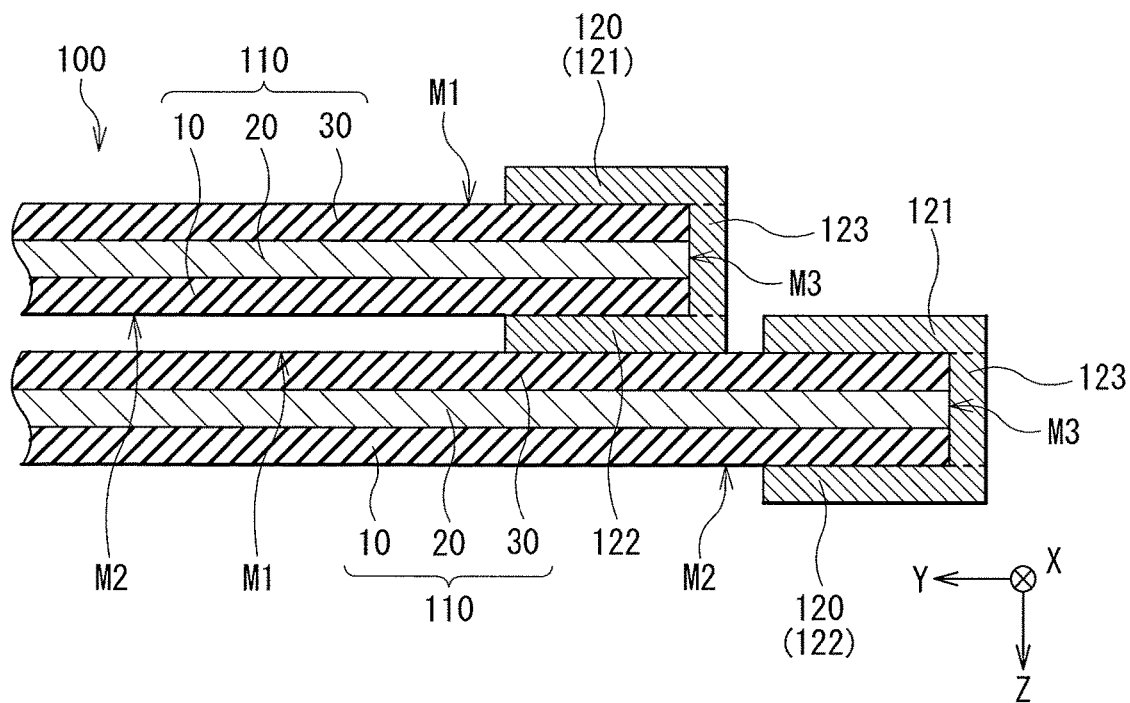

[ FIG. 14 ]
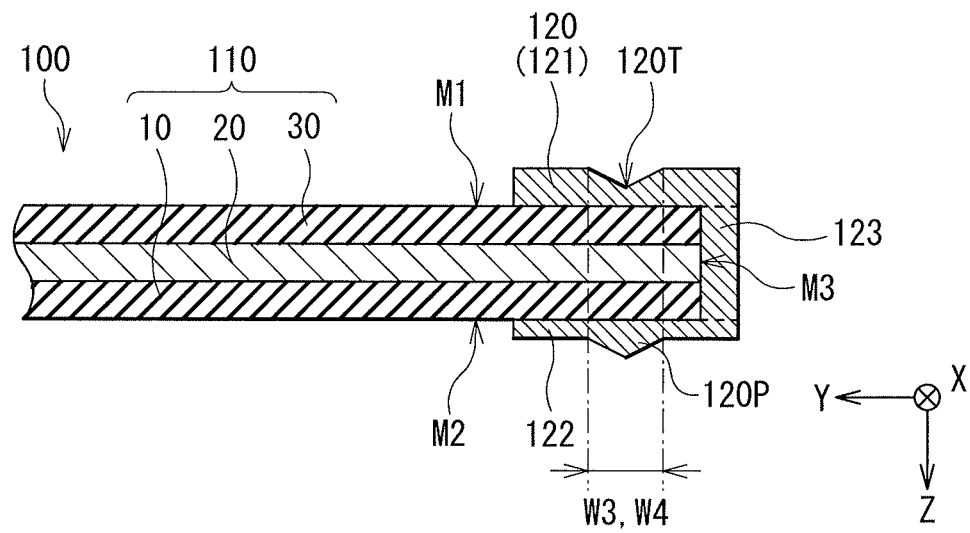
[ FIG. 15 ]
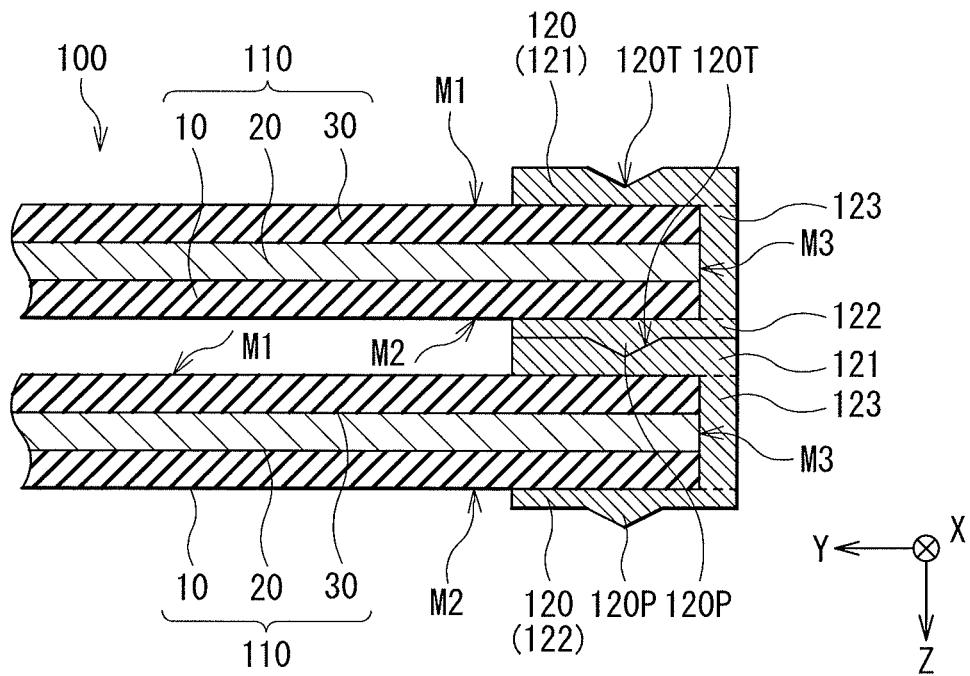

[ FIG. 16 ]
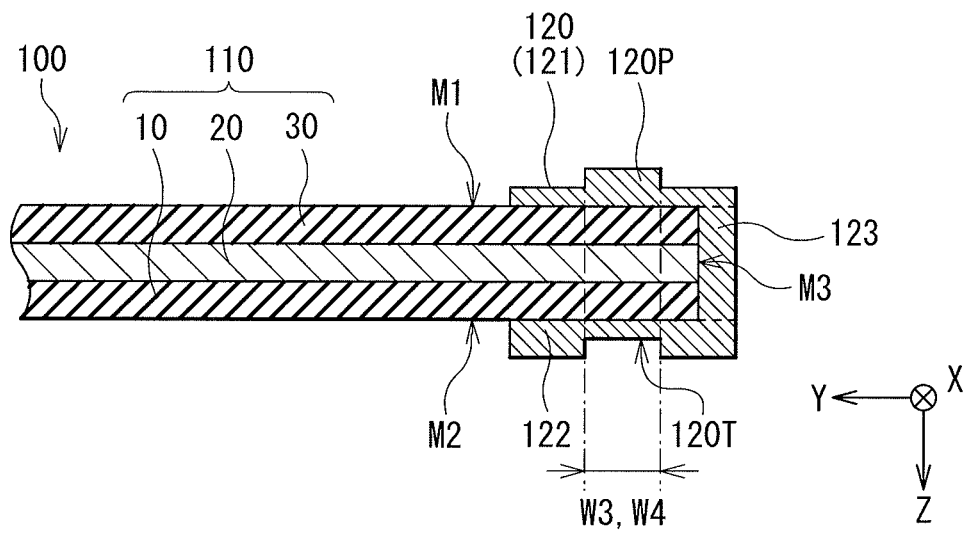
[ FIG. 17 ]
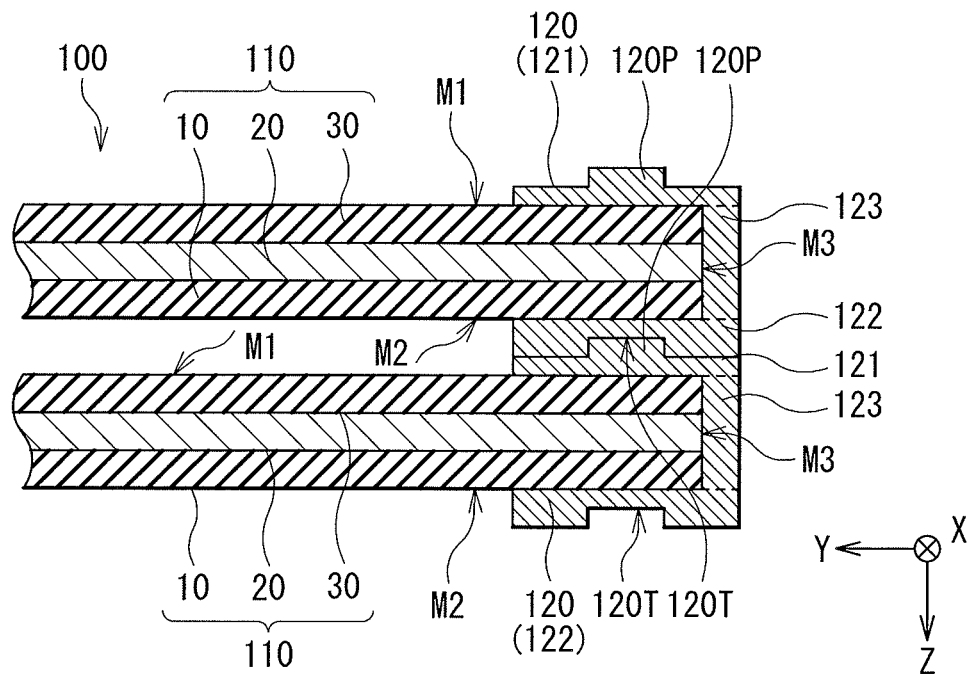

[ FIG. 18 ]
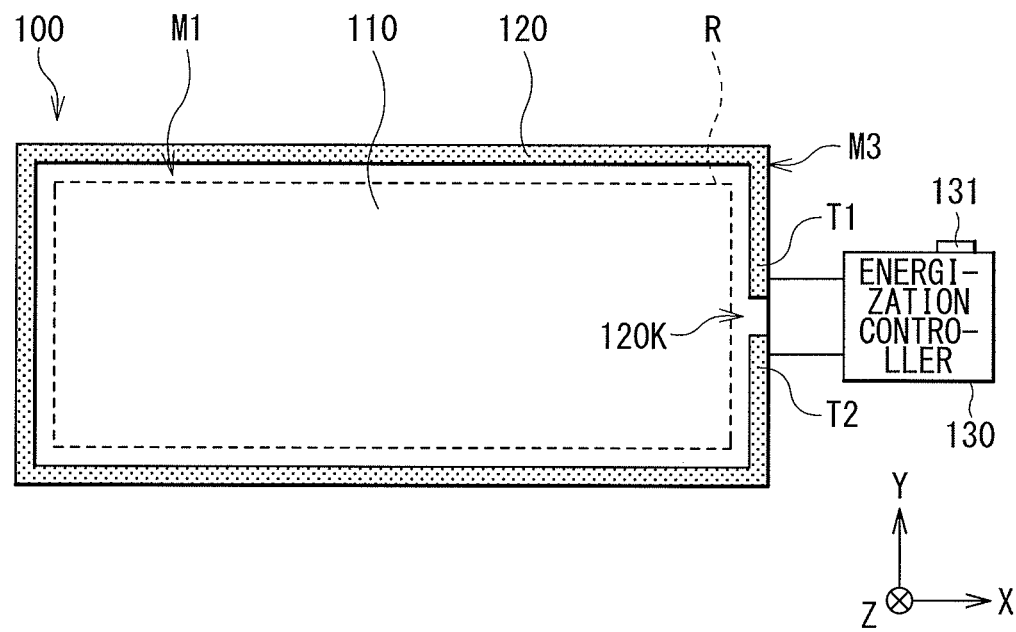

FLEXIBLE DISPLAY WITH PROTECTOR ALONG SIDE SURFACE

CROSS-REFERENCE TO RELATED APPLICATIONS

This application is a national phase entry under 35 U.S.C. § 371 of International Application No. PCT/JP2018/039679 filed Oct. 25, 2018, which claims the priority from Japanese Patent Application No. 2017-235270 filed in the Japanese Patent Office on Dec. 7, 2017, the entire contents of which are hereby incorporated by reference.

TECHNICAL FIELD

The present technology relates to a flexible display that displays images by utilizing an organic light-emitting phenomenon.

BACKGROUND ART

Various stages of research and development have been made on displays that display images by utilizing an organic light-emitting phenomenon, which in other words is organic electroluminescence (EL).

Specifically, an organic light-emitting layer formed on an insulating substrate is covered with a moisture barrier layer and a moisture absorbent layer in order to decrease the degree of reduction in luminous efficiency in the organic light-emitting layer due to moisture (see PTL 1, for example). In another instance, a display has been proposed which is pliable (i.e., flexible) in order to achieve greater adaptability in terms of the usage of the display (see PTL 2, for example).

CITATION LIST

Patent Literature

PTL 1: Japanese Unexamined Patent Application Publication No. 2007-220593
PTL 2: Japanese Patent No. 6004570

SUMMARY OF THE INVENTION

Various studies have been made on configurations of displays that display images by utilizing the organic light-emitting phenomenon. However, display performance of flexible displays that display images by utilizing the organic light-emitting phenomenon is still insufficient and there is room for improvement.

It is therefore desirable to provide a display able to deliver excellent display performance.

A display according to the present technology includes: a display section including a flexible base and an image display layer that is supported by the flexible base and displays an image by utilizing an organic light-emitting phenomenon, in which the display section has a display surface on which the image is to be displayed, a back surface located opposite to the display surface, and a side surface located between the display surface and the back surface and coupled to each of the display surface and the back surface; and a protector provided along at least a portion of the side surface of the display section. The protector includes a metal layer and covers a region extending from a portion of the display surface through the side surface to a portion of the back surface.

Since the protector including the metal layer is provided along at least a portion of the side surface of the display section and covers a region extending from a portion of the display surface through the side surface to a portion of the back surface, the display according to the present technology is able to deliver excellent display performance.

It should be noted that the above-described effect is not necessarily limiting. Any of the effects indicated in the present technology may be exerted.

BRIEF DESCRIPTION OF DRAWING

FIG. 1 is a plan view of a configuration of a display according to an embodiment of the present technology.

FIG. 2 is a cross-sectional view of the configuration of the display taken along line A-A in FIG. 1.

FIG. 3 is a cross-sectional view of the configuration of the display taken along line B-B in FIG. 1.

FIG. 4 is a perspective view for explaining a use of the display illustrated in FIG. 1.

FIG. 5 is an enlarged cross-sectional view of a configuration of a display section illustrated in FIG. 2.

FIG. 6 is an enlarged cross-sectional view of a portion of a configuration of a protector illustrated in FIG. 2.

FIG. 7 is a cross-sectional view of the configuration of the protector illustrated in FIG. 6.

FIG. 8 is a cross-sectional view for explaining an advantage of rolling the display according to the embodiment of the present technology.

FIG. 9 is a cross-sectional view for explaining a configuration and an issue of a display according to a first comparative example.

FIG. 10 is a cross-sectional view for explaining a configuration and an issue of a display according to a second comparative example.

FIG. 11 is a cross-sectional view of a first modification example of the configuration of the display.

FIG. 12 is a cross-sectional view for explaining an advantage of rolling the display according to the first modification example.

FIG. 13 is a cross-sectional view for explaining a concern about rolling the display.

FIG. 14 is a cross-sectional view of a second modification example of the configuration of the display.

FIG. 15 is a cross-sectional view for explaining an advantage of rolling the display according to the second modification example.

FIG. 16 is a cross-sectional view of a third modification example of the configuration of the display.

FIG. 17 is a cross-sectional view for explaining an advantage of rolling the display according to the third modification example.

FIG. 18 is a plan view of a fourth modification example of the configuration of the display.

MODES FOR CARRYING OUT THE INVENTION

The following describes an embodiment of the present technology in detail with reference to the drawings. It should be noted that the description is given in the following order.

1. Display
   1-1. Overall Configuration
   1-2. Configuration of Display Section
   1-3. Configuration of Protector
   1-4. Operation
   1-5. Workings and Effect
2. Modification Examples 1. Display First, a display according to an embodiment of the present technology will be described.

The display described here is a so-called organic EL display that displays images by utilizing the organic light-emitting phenomenon. In particular, the display is bendable as having flexibility. That is, the display is a so-called flexible display.

<1-1. Overall Configuration>

First, an overall configuration of the display will be described.

FIG. 1 is a plan view of a configuration of a display 100, which is a specific example of the above-described display. FIG. 2 is a cross-sectional view of the configuration of the display 100 taken along line A-A in FIG. 1. FIG. 3 is a cross-sectional view of the configuration of the display 100 taken along line B-B in FIG. 1. FIG. 4 is a perspective view of the configuration of the display 100 for explaining a use of the display 100 illustrated in FIG. 1.

As illustrated in FIGS. 1 to 3, the display 100 includes a display section 110 and a protector 120 provided on the display section 110.

The display 100 for example displays images in a direction away from the plane of FIG. 1. That is, a surface of the display 100 facing in the direction away from the plane of FIG. 1 is a display surface M1, which in other words is an image-display-side surface.

[Display Section]

The display section 110 is a main section of the display 100 and is a member that displays images by utilizing the above-described organic light-emitting phenomenon.

The display section 110 has an image display region R, which is represented by a dashed line in FIG. 1. Images are displayed in the image display region R. Here, the image display region R is for example located in the middle of the display section 110. Thus, images are displayed in the image display region R. By contrast, no image is displayed in a region other than the image display region R, which in other words is a region outside the image display region R.

As illustrated in FIGS. 2 and 3, for example, the display section 110 is a laminate of a supporting base 10, an image display layer 20, and a protective base 30 stacked in this order.

Furthermore, as illustrated in FIGS. 1 to 3, the display section 110 has a back surface M2 and a side surface M3 as well as the above-described display surface M1. As described above, the display surface M1 is an image-display-side surface. The back surface M2 is located opposite to the display surface M1. The side surface M3 is located between the display surface M1 and the back surface M2 and coupled to each of the display surface M1 and the back surface M2.

(Supporting Base)

The supporting base 10 is flexible and supports the image display layer 20. No particular limitations are placed on the material of the supporting base 10 as long as the above-described flexibility is ensured. Specifically, the supporting base 10 is for example a polymeric sheet such as a polyimide sheet. The "polymeric sheet" means a polymer formed into a sheet shape. The supporting base 10 here is what is referred to as "a flexible base" according to an embodiment of the present technology.

(Protective Base)

The protective base 30 is flexible and protects the image display layer 20. The protective base 30 for example has a similar configuration to the above-described supporting base 10. However, the material of the protective base 30 may be the same as the material of the supporting base 10 or may be different from the material of the supporting base 10.

Note that the display surface M1 is a surface positioned on the side of the protective base 20. Accordingly, the supporting base 10 is for example non-light transmissive, and the protective base 30 is for example light transmissive.

(Image Display Layer)

The image display layer 20 displays images by utilizing the organic light-emitting phenomenon. The image display layer 20 is for example disposed on the supporting base 10 and covered with the protective base 30. The image display layer 20 is therefore supported by the supporting base 10 and protected by the protective base 30.

No particular limitations are placed on the planar shape of the display section 110, which in other words is a shape of the display section 110 viewed from a Z-axis direction. The display section 110 here for example has a quadrilateral (rectangular) planar shape.

It should be noted that a configuration of the image display layer 20 will be described in detail below (see FIG. 5).

(Use)

As described above, the display section 120 includes the supporting base 10, the protective base 30, and the image display layer 20 held therebetween. The display section 120 is therefore bendable owing to the flexibility of the supporting base 10 and the flexibility of the protective base 30.

As a result, the display 100 as a whole is also bendable, and therefore it is possible to roll the display 100 in a predetermined direction (a bending direction D) into a cylindrical shape as illustrated in FIG. 4, for example. FIG. 4 illustrates, for example, the display 100 with a portion thereof rolled in a longitudinal direction of the display 100.

Specifically, the display 100 is rolled for example in the rolling direction D (X-axis direction) as illustrated in FIG. 4 and thus stored when not in use. On the other hand, the display 100 is unrolled for example into a substantially flat sheet shape as illustrated in FIG. 1 for use.

[Protector]

The protector 120 is a member that environmentally and physically protects the display section 110. In both FIGS. 1 and 4, the protector 120 is hatched to highlight a position and a range of the protector 120.

Specifically, the protector 120 prevents moisture from entering the inside of the display section 110 from outside (water resistance) and prevents the display surface M1 from getting damaged when the display 100 is rolled (abrasion resistance).

The protector 120 is provided along the side surface M3 of the display section 110. Note that the protector 120 may be provided along the entirety of the side surface M3 or may be provided along a portion of the side surface M3. In a case where the protector 120 is provided along a portion of the side surface M3, needless to say, the protector 120 may be provided in a plurality of positions separated from one another. FIGS. 1 to 4 illustrate, for example, the protector 120 provided along the entirety of the side surface M3.

No particular limitations are placed on the range in which the protector 120 is formed as long as the protector 120 is provided along the side surface M3 of the display section 110 as described above. In particular, the protector 120 is preferably provided in the region other than the image display region R, which in other words is the region outside the image display region R. One reason for this is that the protector 120 is kept from blocking an image being displayed by the display 100. Such a configuration prevents the presence of the protector 120 from undesirably narrowing an image display range.

It should be noted that a configuration of the protector 120 will be described in detail below (see FIGS. 6 and 7).

<1-2. Configuration of Display Section>

Next, a configuration of the display section 110 will be described. The following mainly makes reference to the configuration of the image display layer 20, which is a main part of the display section 110. However, the configuration of the image display layer 20 described below is merely a specific example, and the image display layer 20 is not limited to the configuration described below.

FIG. 5 is an enlarged cross-sectional view of the configuration of the display section 110 illustrated in FIG. 2. In order to make the configuration of the image display layer 20 easier to see, however, a Z-axis dimension of the image display layer 20 is drawn larger than a Z-axis dimension of the supporting base 10 and a Z-axis dimension of the protective base 30 in FIG. 5.

The display section 110 described here for example adopts a top emission display method, by which light H generated in the image display layer 20 for displaying an image is emitted to the outside through the protective base 30. Accordingly, the image is displayed on the surface on which the protective base 30 is disposed (on the display surface M1).

The image display layer 20 includes, for example, a plurality of organic light-emitting elements 26 that emits the light H by utilizing the organic light-emitting phenomenon as illustrated in FIG. 5. The image display layer 20 here includes, for example, red organic light-emitting elements 26R that emit red light HPR (having a wavelength of approximately 620 nm, for example), green organic light-emitting elements 26G that emit green light HPG (having a wavelength of approximately 530 nm, for example), and blue organic light-emitting elements 26B that emit blue light HPB (having a wavelength of approximately 460 nm, for example).

More specifically, the image display layer 20 includes, for example, a plurality of driving elements 21, an inter-layer dielectric layer 22, a plurality of driving wiring lines 23, a planarizing dielectric layer 24, an intra-layer dielectric layer 25, the red organic light-emitting elements 26R, the green organic light-emitting elements 26G, the blue organic light-emitting elements 26B, a protective layer 27, a bonding layer 28, and a color filter 29. These constituent elements of the image display layer 20 are for example formed on a surface of the supporting base 10 in this order, thereby providing a series of the constituent elements stacked in that order.

[Plurality of Driving Elements]

Each of the plurality of driving elements 21 drives a corresponding one of the red organic light-emitting elements 26R, the green organic light-emitting elements 26G, and the blue organic light-emitting elements 26B. The plurality of driving elements 21 is for example arranged in a matrix. Each of the plurality of driving elements 21 is for example a thin film transistor (TFT) and is coupled to a corresponding one of the driving wiring lines 33.

[Inter-Layer Dielectric Layer]

The inter-layer dielectric layer 22 is a layer that electrically isolates the plurality of driving elements 21 from its surroundings and includes, for example, any one of insulating materials such as silicon oxide ($SiO_2$) or PSG (phosphosilicate glass) or two or more of such insulating materials. The inter-layer dielectric layer 22 is for example formed so as to cover the plurality of driving elements 21 and portions of the supporting base 10 therearound.

[Plurality of Driving Wiring Lines]

Each of the plurality of driving wiring lines 23 functions as a signal line that drives a corresponding one of the red organic light-emitting elements 26R, the green organic light-emitting elements 26G, and the blue organic light-emitting elements 26B. The plurality of driving wiring lines 23 includes, for example, any one of conductive materials such as aluminum (Al) or an aluminum-copper alloy (AlCu) or two or more of such conductive materials. Each of the plurality of driving wiring lines 23 is coupled to any of the red organic light-emitting elements 26R, the green organic light-emitting elements 26G, and the blue organic light-emitting elements 26B. It should be noted that two driving wiring lines 23 are for example provided for each of the driving elements 21, and the two driving wiring lines 23 for example function as a gate signal line and a drain signal line.

[Planarizing Dielectric Layer]

The planarizing dielectric layer 24 electrically isolates the driving elements 21 and the driving wiring lines 23 from the red organic light-emitting elements 26R, the green organic light-emitting elements 26G, and the blue organic light-emitting elements 26B. However, the planarizing dielectric layer 24 also functions as a layer that planarizes an underlayer on which each of the red organic light-emitting elements 26R, the green organic light-emitting elements 26G, and the blue organic light-emitting elements 26B is disposed. The planarizing dielectric layer 24 includes, for example, any one of insulating materials such as silicon oxide ($SiO_2$) or two or more of such insulating materials.

[Red, Green, and Blue Organic Light-Emitting Elements]

The red organic light-emitting elements 26R, the green organic light-emitting elements 26G, and the blue organic light-emitting elements 26B are arranged in a matrix as in the case of the driving elements 21. The image display layer 20 includes a plurality of sets of the red organic light-emitting elements 26R, the green organic light-emitting elements 26G, and the blue organic light-emitting elements 26B. Each of the sets includes one red organic light-emitting element 26R, one green organic light-emitting element 26G, and one blue organic light-emitting element 26B.

Each of the red organic light-emitting elements 26R includes, for example, a lower electrode layer 261, an organic light-emitting layer 262, and an upper electrode layer 263. The lower electrode layer 261, the organic light-emitting layer 262, and the upper electrode layer 263 are for example stacked on the planarizing dielectric layer 24 in this order.

The lower electrode layers 261 are individual electrodes arranged in a matrix as in the case of the plurality of driving elements 21, and include, for example, any one of conductive materials such as silver (Ag) or gold (Au) or two or more of such conductive materials.

The organic light-emitting layers 262 emit red light HR and are each for example a laminate including a plurality of layers. The plurality of layers includes, for example, a light-emitting layer that emits the red light HR and any one of layers such as a hole injection layer, a hole transport layer, an electron injection layer, or a hole transport layer or two or more of such layers.

Unlike the lower electrode layers 261 (individual electrodes) arranged in a matrix, the upper electrode layer 263 is a common electrode that spans all of the red organic light-emitting elements 26R, the green organic light-emitting elements 26G, and the blue organic light-emitting elements 26B. The upper electrode 263 includes, for example, any one of light transmissive conductive materials such as indium tin oxide (ITO) or two or more of such light transmissive conductive materials in order to guide the red light HR from the organic light-emitting layers 262 to the protective base 30.

The green organic light-emitting elements 25G have a similar configuration to the red organic light-emitting elements 26R, for example, other than each including an organic light-emitting layer 262 that generates green light HG instead of the organic light-emitting layer 262 that generates the red light HR. The blue organic light-emitting elements 26B have a similar configuration to the red organic light-emitting elements 26R, for example, other than each including an organic light-emitting layer 262 that generates blue light HB instead of the organic light-emitting layer 262 that generates the red light HR.

[Intra-layer Dielectric Layer]

The intra-layer dielectric layer 26 isolates the red organic light-emitting elements 26R, the green organic light-emitting elements 26G, and the blue organic light-emitting elements 26B from one another, and includes, for example, any one of insulating materials such as polyimide or two or more of such insulating materials.

[Protective Layer]

The protective layer 27 protects the red organic light-emitting elements 26R, the green organic light-emitting elements 26G, and the blue organic light-emitting elements 26B, and includes, for example, any one of light transmissive dielectric materials such as silicon nitride (SiN) or two or more of such light transmissive dielectric materials.

[Bonding Layer]

The bonding layer 28 bonds the protective layer 27 and the color filter 29 together, and includes, for example, any one of adhesive agents such as a light transmissive thermosetting resin or two or more of such adhesive agents.

[Color Filter]

The color filter 29 is a member through which the red light HR, the green light HG, and the blue light HB generated in the red organic light-emitting elements 26R, the green organic light-emitting elements 26G, and the blue organic light-emitting elements 26B pass. Note that the color filter 29 also functions to prevent a reduction in contrast due to entry of outside light into the inside of the image display layer 20.

The color filter 29 includes, for example, red filter regions 29R corresponding to the red organic light-emitting elements 26R, green filter regions 29G corresponding to the green organic light-emitting elements 26G, and blue filter regions 29B corresponding to the blue organic light-emitting elements 26B.

<1-3. Configuration of Protector>

The following describes the configuration of the protector 120.

FIG. 6 is an enlarged cross-sectional view of a portion of the configuration of the display 100 illustrated in FIG. 2. FIG. 7 is a cross-sectional view of the configuration of the protector 120 illustrated in FIG. 6.

[Range of Protector]

As described above, the display section 110 has the display surface M1, the back surface M2, and the side surface M3, and the protector 120 is provided on and around the side surface M3 of the display section 110.

Specifically, the protector 120 covers a region extending from a portion of the display surface M1 through the side surface M3 to a portion of the back surface M2 as illustrated in FIG. 6. That is, the protector 120 continuously extends along the display surface M1, the side surface M3, and the back surface M2 in this order. The protector 120 is therefore bent at a joint between the display surface M1 and the side surface M3 and at a joint between the side surface M3 and the back surface M2. This allows a range for the protector 120 to cover the display section 110 to expand to each of the display surface M1 and the back surface M2 instead of being restricted to the side surface M3.

It should be noted that an X-axis range for the protector 120 to cover the display surface M1 (a covering width W1) is not particularly limited and may therefore be set to any range. Likewise, an X-axis range for the protector 120 to cover the back surface M2 (a covering width W2) is not particularly limited and may therefore be set to any range. The covering widths W1 and W2 may be the same as each other or may be different from each other.

A thickness T of the protector 120 is not particularly limited and may therefore be set to any thickness. The thickness T of the protector 120 may be constant or vary.

The protector 120 includes, for example, a first protection part 121, a second protection part 122, and a third protection part 123. The first protection part 121 covers the display surface M1 so as to avoid covering the image display region R. The second protection part 122 covers the back surface M2. The third protection part 123 covers the side surface M3 and is coupled to each of the first protection part 121 and the second protection part 122. In FIG. 6, a boundary between the first protection part 121 and the third protection part 122 is represented by a dashed line, and a boundary between the second protection part 122 and the third protection part 123 is represented by a dashed line.

The protector 120 covers the side surface M3 because by doing so, the protector 120 blocks the side surface M3 from the outside, and thus moisture does not easily enter the inside of the display section 110 through the side surface M3.

Specifically, in the display section 110, the supporting base 10, the image display layer 20, and the protective base 30 are stacked in this order. As such, on the side surface M3, an interface between the supporting base 10 and the image display layer 20 is exposed, and an interface between the protective base 30 and the image display layer 20 is also exposed.

In this case, with the side surface M3 exposed, moisture easily enters the inside of the display section 110 through the interface between the supporting base 10 and the image display layer 20, which in other words is a gap between the supporting base 10 and the image display layer 20. Likewise, in this case, moisture easily enters the inside of the display section 110 through the interface between the protective base 30 and the image display layer 20, which in other words is a gap between the protective base 30 and the image display layer 20.

With the side surface M3 covered with the protector 120, by contrast, moisture does not easily enter the inside of the display section 110 through the gap between the supporting base 10 and the image display layer 20 and the gap between the protective base 30 and the image display layer 20 as well.

Thus, the display section 110 is environmentally protected by utilizing the above-described water resistance resulting from the protector 120.

Furthermore, the protector 120 covers both the display surface M1 and the back surface M2 because in such a configuration, the display surface M1 does not easily get damaged when the display 100 is rolled in the rolling direction D into a cylindrical shape (see FIG. 4).

Specifically, since images are displayed on the display surface M1 in the display section 110, the display surface M1 is desirably protected from getting damaged when the display 100 is handled.

Without the protector 120 covering both the display surface M1 and the back surface M2, however, the display surface M1 and the back surface M2 easily come in contact with each other as described below (see FIGS. 9 and 10) when the display 100 is rolled. As a result, when the display 100 is unrolled for use, the display surface M1 and the back surface M2 rub against each other, easily damaging the display surface M1.

With the protector 120 covering both the display surface M1 and the back surface M2, by contrast, the display surface M1 and the back surface M2 do not easily come in contact with each other as described below (see FIG. 8), because the protector 120 functions as a so-called spacer when the display 100 is rolled. As a result, the display surface M1 and the back surface M2 do not easily rub against each other when the display 100 is unrolled. Thus, the display surface M1 is physically protected by utilizing the above-described abrasion resistance resulting from the protector 120 (see FIG. 8).

It should be noted that the protector 120 is preferably provided in the region other than the image display region R as described above. That is, the protector 120 preferably covers the display surface M1 so as to only cover the region outside the image display region R.

[Layer Configuration of Protector]

The protector 120 includes, for example, a moisture impermeable metal layer 120A as illustrated in FIG. 7 in order to ensure the above-described water resistance. The metal layer 120A includes, for example, any one of metal materials such as aluminum (Al) or two or more of such metal materials. One reason for this is that such materials enable the protector 120 to be sufficiently moisture impermeable.

It should be noted that the metal layer 120A may include, for example, any one of fibrous metal materials such as so-called biofiber or two or more of such fibrous metal materials as long as the metal layer 120A is moisture impermeable. In this case, for example, a fibrous metal material may be interwoven into a band-like shape. The biometal fiber is a fibrous actuator given anisotropic texture to exert excellent properties (for example but not limited to, rigidity) in a specific direction and includes, for example but not limited to, an Ti—Ni-based shape-memory alloy.

No particular limitations are placed on the layer configuration of the protector 120 as long as the protector 120 includes the above-described metal layer 120A. Here, the protector 120 is for example water-resistant adhesive tape. The protector 120 is therefore a laminate of the metal layer 120A and a bonding layer 120B stacked on each other as illustrated in FIG. 7, for example.

The bonding layer 120B includes, for example, any one of adhesive agents such as a thermosetting resin or two or more of such adhesive agents. The protector 120 including the bonding layer 120B for example has a bonding surface S on a side of the bonding layer 120B. In this case, for example, the bonding surface S of the protector 120 is attached to each of the display surface M1, the back surface M2, and the side surface M3.

It should be noted that in a case where the protector 120 is adhesive tape, for example, the larger the above-described covering width W1 of the protector 120 is, the larger an area of bond between the protector 120 and the display surface M1 is, and the less likely the protector 120 is to come off the display surface M1. In this case, needless to say, the larger the above-described covering width W2 of the protector 120 is, the less likely the protector 120 is to come off the back surface M2.

<1-4. Operation>

Next, an operation of the display 100 will be described. The following first describes an image displaying operation, and then describes an advantage of rolling the display 100.

[Image Display Operation]

Before use, the display 100 is for example in a cylindrical shape as a result of being rolled in the rolling direction D as illustrated in FIG. 4.

For use, the display 100 is for example unrolled into a substantially flat sheet shape as illustrated in FIGS. 1 and 4.

In the display 100, voltage is applied between the upper electrode layer 263 and the lower electrode layers 261 using the plurality of driving elements 21 to cause hole-electron recombination in the organic light-emitting layers 262. As a result, the organic light-emitting layers 262 emit light. Through the above, the red organic light-emitting elements 25R emit the red light HR, the green organic light-emitting elements 25G emit the green light HG, and the blue organic light-emitting elements 25B emit the blue light HB. Thus, each of the red light HR, the green light HG, and the blue light HB is emitted to the outside through the color filter 29 and the protective base 30 in this order. The red light HR, the green light HG, and the blue light HB thus emitted are used to display a full-color image on the display surface M1.

[Advantage of Rolling Display]

FIG. 8 is a cross-sectional view of the configuration of the display 100 corresponding to FIG. 6 for explaining an advantage of rolling the display 100. Note that FIG. 8 illustrates a cross-section of the display 100 in a cylindrical shape as a result of being rolled in the rolling direction D as illustrated in FIG. 4.

When not in use, for example, the display 100 is rolled as illustrated in FIGS. 4 and 8.

In the display 100 in such a rolled state, as illustrated in FIG. 8, the protector 120 provided on the display section 110 is interposed between the overlapping portions of the display section 110 to function as a spacer that keeps the overlapping portions of the display section 110 from coming in contact with each other. In this case, portions of the protector 120 are in contact with each other, but the portions of the display section 110 are separated from each other because of the thickness of the portions of the protector 120. Thus, the display surface M1 and the back surface M2 do not easily come in contact with each other.

As a result, the back surface M2 does not easily rub against the display surface M1, and therefore the display surface M1 does not easily get damaged even when the display 100 is rolled by utilizing its flexibility or when the rolled display 100 is unrolled for use.

It should be noted that the larger the above-described thickness T of the protector 120 is, the larger a distance between the overlapping portions of the display section 110, and the less likely the display surface M1 and the back surface M2 are to come in contact with each other.

<1-5. Workings and Effect>

Lastly, workings and effect of the display 100 will be described.

[Main Workings and Effect]

In the display 100, the protector 120 including the metal layer 120A is provided along the side surface M3 of the display section 110, and the protector 120 covers the region extending from a portion of the display surface M1 through the side surface M2 to a portion of the back surface M2. As such, the display 100 is able to deliver excellent display performance for the following reason.

FIG. 9 is a cross-sectional view of a configuration of a display 200 according to a first comparative example corresponding to FIG. 8 for explaining the configuration and an issue of the display 200. Likewise, FIG. 10 is a cross-sectional view of a configuration of a display 300 according to a second comparative example corresponding to FIG. 8 for explaining the configuration and an issue of the display 300.

The display 200 according to the first comparative example has a similar configuration to the display 100 according to the present embodiment except that, for example, the display 200 does not have the protector 120 on the display section 110. The display 300 according to the second comparative example has a similar configuration to the display 100 according to the present embodiment except that, for example, the display 300 includes a protector 320 only covering the side surface M3 instead of the protector 120 covering the region extending from a portion of the display surface M1 through the side surface M3 to a portion of the back surface M2.

The display 200 according to the first comparative example is rollable by utilizing its flexibility as illustrated in FIG. 9. However, the display section 110 is exposed on the side surface M3, allowing moisture to easily enter the inside of the display section 110 as described above. In this case, the organic light-emitting layers 262 are deactivated and eventually deteriorated due to the entry of moisture, reducing the image display performance. Besides, the display surface M1 and the back surface M2 come in contact with each other when the display 200 is rolled. The back surface M2 therefore easily rubs against the display surface M1. As a result, the display surface M1 is damaged, also reducing the image display performance.

As such, the display 200 according to the first comparative example deteriorates in image display performance due to entry of moisture and abrasion of the display surface M1. It is therefore difficult for the display 200 to deliver excellent image display performance.

Furthermore, as in the case of the display 200 according to the first comparative example, the display 300 according to the second comparative example is rollable as illustrated in FIG. 10. In this case, the side surface M3 of the display section 110 is covered with the protector 320, and therefore moisture does not easily enter the inside of the display section 110. This reduces the possibility that the image display performance deteriorates due to entry of moisture. However, the display surface M1 and the back surface M2 come in contact with each other when the display 300 is rolled. The back surface M2 therefore easily rubs against the display surface M1.

As such, the display 300 according to the second comparative example is protected from deteriorating in image display performance due to entry of moisture but is not protected from deteriorating in image display performance due to abrasion of the display surface M1. It is therefore difficult even for the display 300 to deliver excellent image display performance.

The display 100 according to the present embodiment is rollable as illustrated in FIGS. 6 and 8 as in the case of the display 200 according to the first comparative example and the display 300 according to the second comparative example. In the case of the display 100, however, the side surface M3 of the display section 110 is covered with the protector 120, so that the display 100 is protected from deteriorating in image display performance due to entry of moisture. Furthermore, the protector 120 separates the display surface M1 and the back surface M2 from each other when the display 100 is rolled, so that the display surface M1 and the back surface M2 do not easily come in contact with each other. This keeps the back surface M2 from easily rubbing against the display surface M1 and reduces the possibility that the image display performance deteriorates due to abrasion of the display surface M1.

Since the display 100 according to the present embodiment is protected from deteriorating in image display performance due to entry of moisture and is also protected from deteriorating in image display performance due to abrasion of the display surface M1 as described above, it is possible for the display 100 to deliver excellent display performance.

[Other Workings and Effect]

In particular, the protector 120 of the display 100 according to the present embodiment does not block images as long as the protector 120 is provided in the region other than the image display region R. It is therefore possible to prevent a situation in which the presence of the protector 120 undesirably narrows the image display range, making the display 100 more effective.

Furthermore, the protector 120 is sufficiently moisture impermeable as long as the metal layer 120A of the protector 120 includes a metal material such as aluminum, making the display 100 more effective.

2. Modification Examples

The above-described configuration of the display 100 may be altered as appropriate. It should be noted that among a series of modification examples described below, any two or more modification examples may be combined.

Modification Example 1

As illustrated in FIG. 11 corresponding to FIG. 6, for example, a groove 120T may be provided in the first protection part 121 extending in the rolling direction D, and a protrusion 120P may be provided on the second protection part 122 extending in the rolling direction D.

The "first protection part 121 extending in the rolling direction D" as used herein refers to a pair of portions of the first protection part 121 that extend in the rolling direction D (X-axis direction) in a case where the first protection part 121 is provided on four sides 113 of the display section 110 as illustrated in FIG. 1.

The "second protection part 122 extending in the rolling direction D" as used herein refers to a pair of portions of the second protection part 121 that extend in the rolling direction D (X-axis direction) in a case where the second protection part 122 is provided on the four sides 113 of the display section 110 as illustrated in FIG. 1.

The protrusion 120P for example extends in the rolling direction D and protrudes in a direction (Z-axis direction) intersecting with the back surface M2. A Y-axis dimension (a protrusion width W3) of the protrusion 120P is for example constant in the Z-axis direction.

Like the above-described protrusion 120P, the groove 120T for example extends in the rolling direction D and is recessed in the direction (Z-axis direction) intersecting with the display surface M1. A Y-axis dimension (a groove width W4) of the groove 120T is for example constant in the Z-axis direction.

The groove 120T is in a position that corresponds to the protrusion 120P when portions of the protector 120 overlap each other as a result of the display 100 being rolled. It is therefore possible to fit the protrusion 120P provided on one of the portions of the protector 120 into the groove 120T provided in another of the portions of the protector 120 when the portions of the protector 120 overlap with each other.

The number of protrusions 120P is not particularly limited and may be one, or two or more. Likewise, the number of grooves 120T is not particularly limited and may be one, or two or more. However, in order to fit the protrusion(s) 120P into the groove(s) 120T, it is preferable that the number of protrusions 120P and the number of grooves 120T be the same. FIG. 11 illustrates, for example, a case where the number of protrusions 120P is one and the number of grooves 120T is also one.

The relationship between the protrusion width W3 and the groove width W4 is not particularly limited as long as it is possible to fit the protrusion(a) 120P into the groove(s) 120T. Specifically, the protrusion width W3 and the groove width W4 may be the same as each other or may be different from each other. Needless to say, it is preferable that the groove width W4 be larger than the protrusion width W3 in a case where the protrusion width W3 and the groove width W4 are different from each other.

In this case, as illustrated in FIG. 12 corresponding to FIG. 8, the protrusions 120P are continuously fitted into the grooves 120T when the display 100 is rolled. This protects the display surface M1 from easily getting damaged when the display 100 is rolled, making the display 100 more effective.

Specifically, in a case where the protector 120 has no protrusion 120P and no groove 120T as illustrated in FIG. 6, the display 100 being rolled may significantly deviate from the desired rolling direction toward the Y-axis direction as illustrated in FIG. 13 corresponding to FIG. 8. Such a deviation in rolling can cause the protector 120 to fail to overlap itself. In this case, the protector 120 undesirably comes in contact with the display surface M1 and rubs against the display surface M1.

By contrast, in a case where the protector 120 has the protrusion 120P and the groove 120T as illustrated in FIG. 11, the display 100 is rolled while the protrusion 120P is continuously fitted into the groove 120T as illustrated in FIG. 12. That is, the protrusion 120P and the groove 120T function as guides for suppressing the deviation of the display 100 toward the Y-axis direction when the display 100 is rolled. Thus, the deviation in rolling does not easily occur, and the protector 120 readily overlaps itself when the display 100 is rolled. Since the protector 120 does not easily come in contact with the display surface M1, and thus a situation in which the protector 120 undesirably rubs against the display surface M1 is avoided, the display surface M1 is much less likely to get damaged when the display 100 is rolled.

It should be noted that preferably, the groove 120T is formed in the first protection part 121 and the protrusion 120P is formed on the second protection part 122 before the protector 120 is attached to the display section 110. This makes it possible to easily provide the protector 120 for the display section 110 with the protrusion 120P and the groove 120T.

It should be noted that no particular limitations are placed on the method for forming the protrusion 120P and the groove 120T on or in the protector 120. In one specific example, the protrusion 120P or the groove 120T may be formed on or in the metal layer 120A by processing the metal layer 1201A. Alternatively, a resin layer (not illustrated) shaped to have the protrusion 120P or the groove 120T may be provided on the metal layer 120A.

Modification Example 2

In a case where the protector 120 has the protrusion 120P, the protrusion width W3 of the protrusion 120P is not particularly limited. That is, the protrusion width W3 is not limited to being constant in the Z-axis direction (see FIG. 11) and may vary in the Z-axis direction.

Needless to say, the groove width W4 of the groove 120T is not particularly limited, either, as long as it is possible to fit the protrusion 120P into the groove 120T. That is, the groove width W4 is not limited to being constant in the Z-axis direction and may vary in the Z-axis direction.

In one specific example, as illustrated in FIG. 14 corresponding to FIG. 11, the protrusion width W3 may gradually decrease in the Z-axis direction (a protruding direction of the protrusion 120P), and the groove width W4 may gradually decrease in the Z-axis direction (a recessing direction of the groove 120T). That is, the protrusion 120P may for example have a sharp protruding shape with a pair of oblique faces, and the groove 120T may for example have a sharp recessed shape with a pair of oblique faces.

Even in this case, the display 100 is rolled while the protrusion 120P is continuously fitted into the groove 120T as illustrated in FIG. 15 corresponding to FIG. 12. In this case, even if the display 100 being rolled deviates from the desired rolling direction toward the Y-axis direction to some degree, in particular, the deviation of the display 100 toward the Y-axis direction is corrected by sufficiently fitting the protrusion 120P into the groove 120T by utilizing the pair of oblique faces of the protrusion 120P and the pair of oblique faces of the groove 120T. Thus, the display 100 being rolled does not deviate further easily, and the display surface M1 is much less likely to get damaged, making the display 100 more effective.

Modification Example 3

It should be noted that although the first protection part 121 has the groove 120T and the second protection part 122 has the protrusion 120P in FIG. 11, the first protection part 121 may have the protrusion 120P and the second protection part 122 may have the groove 120T as illustrated in FIG. 16 corresponding to FIG. 11, for example.

Even in this case, the display 100 is rolled while the protrusion 120P is continuously fitted into the groove 120T as illustrated in FIG. 17 corresponding to FIG. 12, producing a similar effect.

Modification Example 4

In a case where the metal layer 124 of the protector 120 includes biometal fiber, for example, the shape of the display 100 may be controlled to be flat by utilizing properties of the biometal fiber (rigidity of the shape-memory alloy).

Specifically, as illustrated in FIG. 18 corresponding to FIG. 1, the display 100 may include an energization controller 130, and the energization controller 130 may control properties of the protector 120. The display 100 described here for example has a similar configuration to the display 100 illustrated in FIG. 1 except the following points.

In the display 100 illustrated in FIG. 18, for example, a portion (a lacking portion 120K) of the side surface M3 of the display section 110 is not provided with the protector 120. Accordingly, the protector 120 has two ends T1 and T2. The energization controller 130 is for example coupled to each of the two ends T1 and T2, and thus is able to energize the protector 120 (the metal layer 120A) through the two ends T1 and T2 as necessary.

It should be noted here that the protector 120 extends along the side surface M3 (except the lacking portion 120K) of the display section 110 as described above, and biometal fiber functioning as a shape-memory alloy, for example, is interwoven in the protector 120 so as to exert rigidity in an extending direction of the protector 120 while under energization.

The energization controller 130 is a device that controls an energization state of the protector 120 and includes, for example but not limited to, a power source. It should be noted that the energization controller 130, which is illustrated outside the display section 110 in FIG. 18, is for example mounted in a region of the display section 110 other than the image display region R.

The energization controller 130 does not energize the protector 120 while the display 100 is in the rolled state as illustrated in FIG. 4 because the display 100 is not in use, for example. On the other hand, the energization controller 130 energizes the protector 120 while the display 100 is in an unrolled state as illustrated in FIG. 18 because the display 100 is in use, for example.

It should be noted that no particular limitations are placed on the method for switching the energization controller 130 between enabling and disabling energization of the protector 120. For example, as illustrated in FIG. 18, the display 100 may be provided with a physical switch 131 for switching the energization controller 130 between enabling and disabling energization, so that the energization controller 130 is switched between enabling and disabling energization in accordance with a user's operation on the physical switch 131. For another example, various sensors such as a sensor that detects a bending angle may be mounted in the display 100, so that the energization controller 130 automatically switches between enabling and disabling energization in accordance with a result of detection by the sensors.

In a case where a user operates the physical switch 131, the display 100 for example operates as described below.

In an initial state, the energization controller 130 does not energize the protector 120, leaving the display 100 soft (flexible). As such, the display 100 is in a cylindrical shape as a result of being rolled in the rolling direction D as illustrated in FIG. 4.

When the user is to use the display 100, the user unrolls the display 100 rolled in the rolling direction D to open out the display 100 as illustrated in FIG. 18.

The energization controller 130 energizes the protector 120 in response to the user pressing the physical switch 131. This causes the protector 120 to exert rigidity by utilizing the properties of the biometal fiber to make the display 100 flat. In this case, within the protector 120, a pair of portions extending in the X-axis direction is given rigidity in the X-axis direction and a pair of portions extending in the Y-axis direction is given rigidity in the Y-axis direction. As a result, the protector 120 becomes rigid at the four sides of the display section 110 to make the display 100 self-supporting. This increases flatness of the display 100. In this case, for example, it is possible to prop up the display 100 against a wall or the like by utilizing such a self-supporting state of the display 100.

In response to the user re-pressing the physical switch 131 after having used the display 100, the energization controller 130 stops energizing the protector 120. As a result, the protector 120 becomes soft due to its original flexibility to make the display 100 bendable.

The display 100 after use is therefore rolled by the user again in the rolling direction D into a cylindrical shape as illustrated in FIG. 4. This allows the display 100 after use to be stored compact.

In this case, the display 100 exerts rigidity resulting from the protector 120 as well as water resistance and abrasion resistance resulting from the protector 120. When the display 100 is in use, therefore, it is possible to view images using the display 100 made flat by utilizing the rigidity of the protector 120. This makes it possible to view images displayed on the display 100 in a stable manner compared to a case where the protector 120 does not have rigidity, making the display 100 more effective.

In particular, in a case where the display 100 is rolled into a cylindrical shape after use, the display 100 tends to curl when in use due to what is termed memory, which is modification of behavior resulting from being rolled. However, the rigidity of the protector 120 is utilized to uncurl the display 100 in use against the memory. It is therefore possible to reduce the influence of the memory on the flatness of the display 100.

Through the above, the present technology has been described with reference to an embodiment. However, the present technology is not limited to what has been described with reference to the embodiment, and various modifications are possible.

It should be noted that the effects described herein are merely exemplary and not limiting, and the present technology can exert other effects.

It should be noted that the present technology may be in any of the following configurations.

(1)

A display including:

a display section including a flexible base and an image display layer that is supported by the flexible base and displays an image by utilizing an organic light-emitting phenomenon, the display section having a display surface on which the image is to be displayed, a back surface located opposite to the display surface, and a side surface located between the display surface and the back surface and coupled to each of the display surface and the back surface; and a protector provided along at least a portion of the side surface of the display section, the protector including a metal layer and covering a region extending from a portion of the display surface through the side surface to a portion of the back surface.

(2)

The display according to (1), in which the display section has an image display region in which the image is to be displayed, and the protector is provided in a region other than the image display region.

(3)

The display according to (1) or (2), in which the metal layer includes aluminum.

(4)

The display according to any one of (1) to (3), in which both the display section and the protector are rollable in a predetermined rolling direction, the protector includes a first protection part and a second protection part, the first protection part extending in the rolling direction and covering the portion of the display surface, the second protection part extending in the rolling direction and covering the portion of the back surface, one of the first protection part and the second protection part has a protrusion that extends in the rolling direction and protrudes in a direction intersecting with the rolling direction, and another of the first protection part and the second protection part has a groove that extends in the rolling direction and allows the protrusion to be fitted thereinto.

(5)

The display according to any one of (1) to (4), in which both the display section and the protector are rollable, the metal layer includes biometal fiber, and the display further includes an energization controller that energizes the metal layer when the display section is in an unrolled state and that does not energize the metal layer when the display section is in a rolled state.

The present application claims priority to Japanese Patent Application No. 2017-235270 filed with the Japan Patent Office on Dec. 7, 2017. The contents of this application are incorporated herein by reference in their entirety.

It should be understood by those skilled in the art that various modifications, combinations, sub-combinations, and alterations may occur depending on design requirements and other factors insofar as they are within the scope of the appended claims or the equivalents thereof.

The invention claimed is:

1. A display comprising:
a display section including a flexible base and an image display layer that is supported by the flexible base and displays an image by utilizing an organic light-emitting phenomenon, the display section having a display surface on which the image is to be displayed, a back surface located opposite to the display surface, and a side surface located between the display surface and the back surface and coupled to each of the display surface and the back surface; and
a protector provided along at least a portion of the side surface of the display section, the protector including a metal layer and covering a region extending from a portion of the display surface through the side surface to a portion of the back surface,
wherein
both the display section and the protector are rollable in a predetermined rolling direction,
the protector includes a first protection part and a second protection part, the first protection part extending in the rolling direction and covering the portion of the display surface, the second protection part extending in the rolling direction and covering the portion of the back surface,
one of the first protection part and the second protection part has a protrusion that extends in the rolling direction and protrudes in a direction intersecting with the rolling direction, and
another of the first protection part and the second protection part has a groove that extends in the rolling direction and allows the protrusion to be fitted thereinto.

2. The display according to claim 1, wherein the display section has an image display region in which the image is to be displayed, and the protector is provided in a region other than the image display region.

3. The display according to claim 1, wherein the metal layer includes aluminum.

4. The display according to claim 1, wherein the first protection part has the protrusion that extends in the rolling direction and protrudes in the direction intersecting with the rolling direction, and the second protection part has the groove that extends in the rolling direction and allows the protrusion to be fitted thereinto.

5. The display according to claim 1, wherein the second protection part has the protrusion that extends in the rolling direction and protrudes in the direction intersecting with the rolling direction, and the first protection part has the groove that extends in the rolling direction and allows the protrusion to be fitted thereinto.

6. The display according to claim 1, wherein a width of the protrusion varies.

7. The display according to claim 1, wherein a width of the groove varies.

8. A display comprising:
a display section including a flexible base and an image display layer that is supported by the flexible base and displays an image by utilizing an organic light-emitting phenomenon, the display section having a display surface on which the image is to be displayed, a back surface located opposite to the display surface, and a side surface located between the display surface and the back surface and coupled to each of the display surface and the back surface; and
a protector provided along at least a portion of the side surface of the display section, the protector including a metal layer and covering a region extending from a portion of the display surface through the side surface to a portion of the back surface,
wherein
both the display section and the protector are rollable,
the metal layer includes biometal fiber, and
the display further comprises an energization controller that energizes the metal layer when the display section is in an unrolled state and that does not energize the metal layer when the display section is in a rolled state.

9. The display according to claim 8, wherein the energization controller is operable to energize the metal layer such that the display is controlled to be flat.

10. The display according to claim 5, wherein the metal layer exerts rigidity in an extending direction of the protector when under energization.

11. The display according to claim 8, further comprising a physical switch for switching the energization controller between enabling and disabling energization.

12. The display according to claim 8, wherein when the energization controller does not energize the metal layer, the display is in a soft state.

* * * * *